United States Patent [19]

Poelsler et al.

[11] Patent Number: 5,008,843
[45] Date of Patent: Apr. 16, 1991

[54] SENSOR HAVING AN ANSWERBACK DEVICE

[75] Inventors: Wolf-Dieter Poelsler; Bernd Baumann, both of Weissach, Fed. Rep. of Germany

[73] Assignee: Dr. Ing. h.c.F. Porsche AG, Fed. Rep. of Germany

[21] Appl. No.: 289,325

[22] Filed: Dec. 23, 1988

[30] Foreign Application Priority Data

Dec. 23, 1987 [DE] Fed. Rep. of Germany ....... 3743846

[51] Int. Cl.$^5$ ............................................. G01L 25/00
[52] U.S. Cl. ................... 364/571.02; 364/550; 364/571.04
[58] Field of Search ............... 364/550, 571.02, 571.04

[56] References Cited

U.S. PATENT DOCUMENTS

| 3,921,152 | 11/1975 | Hagar et al. | 364/550 X |
| 4,303,984 | 12/1981 | Houvig | 364/571.07 |
| 4,418,392 | 11/1983 | Hata | 364/557 X |
| 4,831,558 | 5/1989 | Shoup et al. | 364/550 X |
| 4,845,649 | 7/1989 | Eckardt et al. | 364/571.02 |

FOREIGN PATENT DOCUMENTS 3116690 4/1981 Fed. Rep. of Germany .
3142468 10/1981 Fed. Rep. of Germany .
3138046 2/1982 Fed. Rep. of Germany .
3318977 5/1983 Fed. Rep. of Germany .
3446248 12/1984 Fed. Rep. of Germany .

OTHER PUBLICATIONS

Sheingold, "Interface Circuits for Sensing Measured Values", Vienna, 1983, pp. 44–53, 204.

Primary Examiner—Parshotam S. Lall
Assistant Examiner—Edward R. Cosimano
Attorney, Agent, or Firm—Evenson, Wands, Edwards, Lenahan & McKeown

[57] ABSTRACT

A sensor device structurally not combined with an evaluation circuit, for detecting physical magnitudes is equipped with an answerback device, in the memory component of which are stored correction data (sensor identification and characteristic data). The answerback device is connected for the transmission of identification and characteristic data with the evaluation circuit by way of at least two of the lines normally utilized for the measured value transmission and/or the energy supply of the sensor device and by way of a further line serving the transmission of a clock signal and is activatable by the same. With the use of a further measurement line and by a special circuit of the answerback device, correction data can be read-in additionally into the same during a calibration.

9 Claims, 3 Drawing Sheets

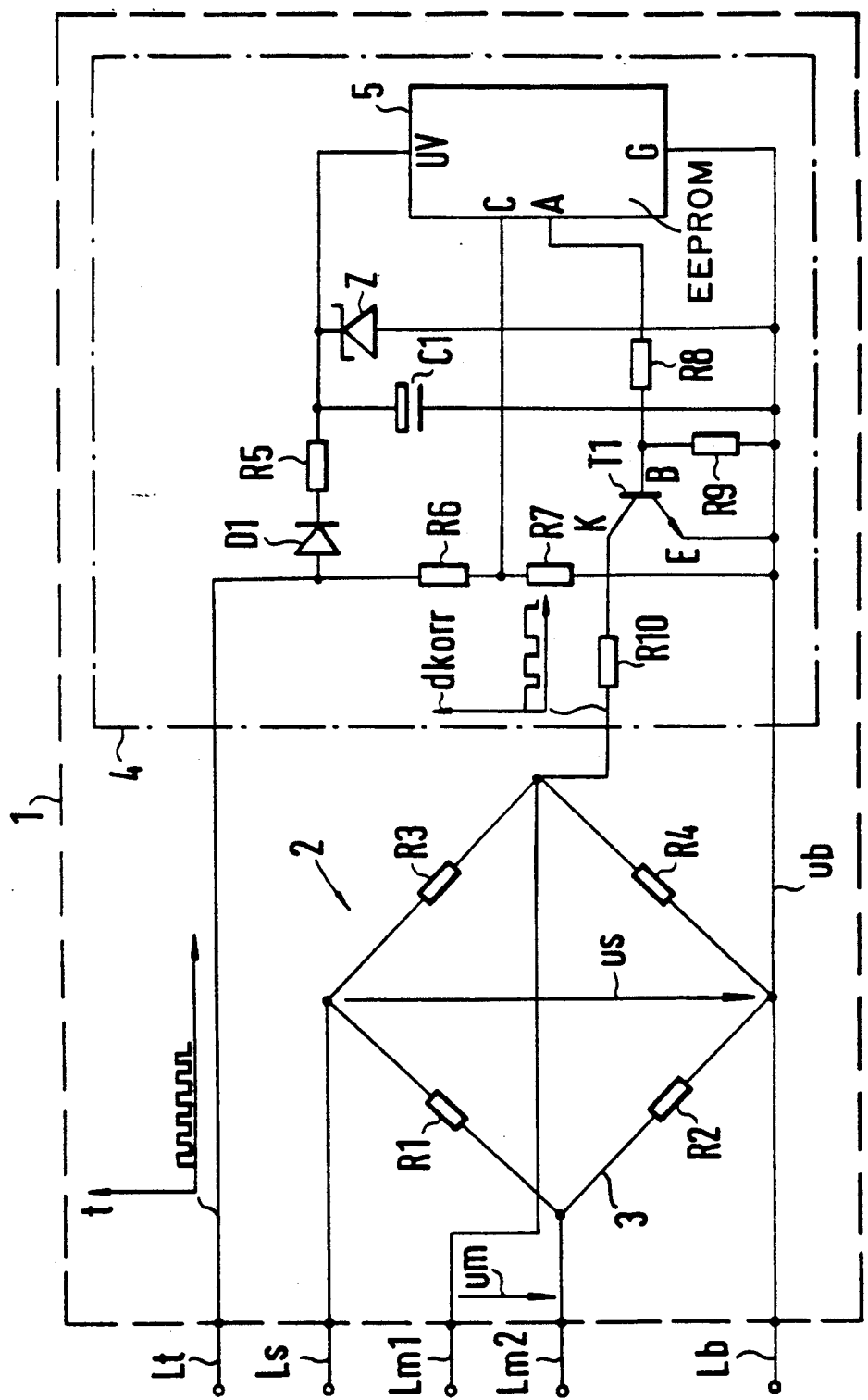

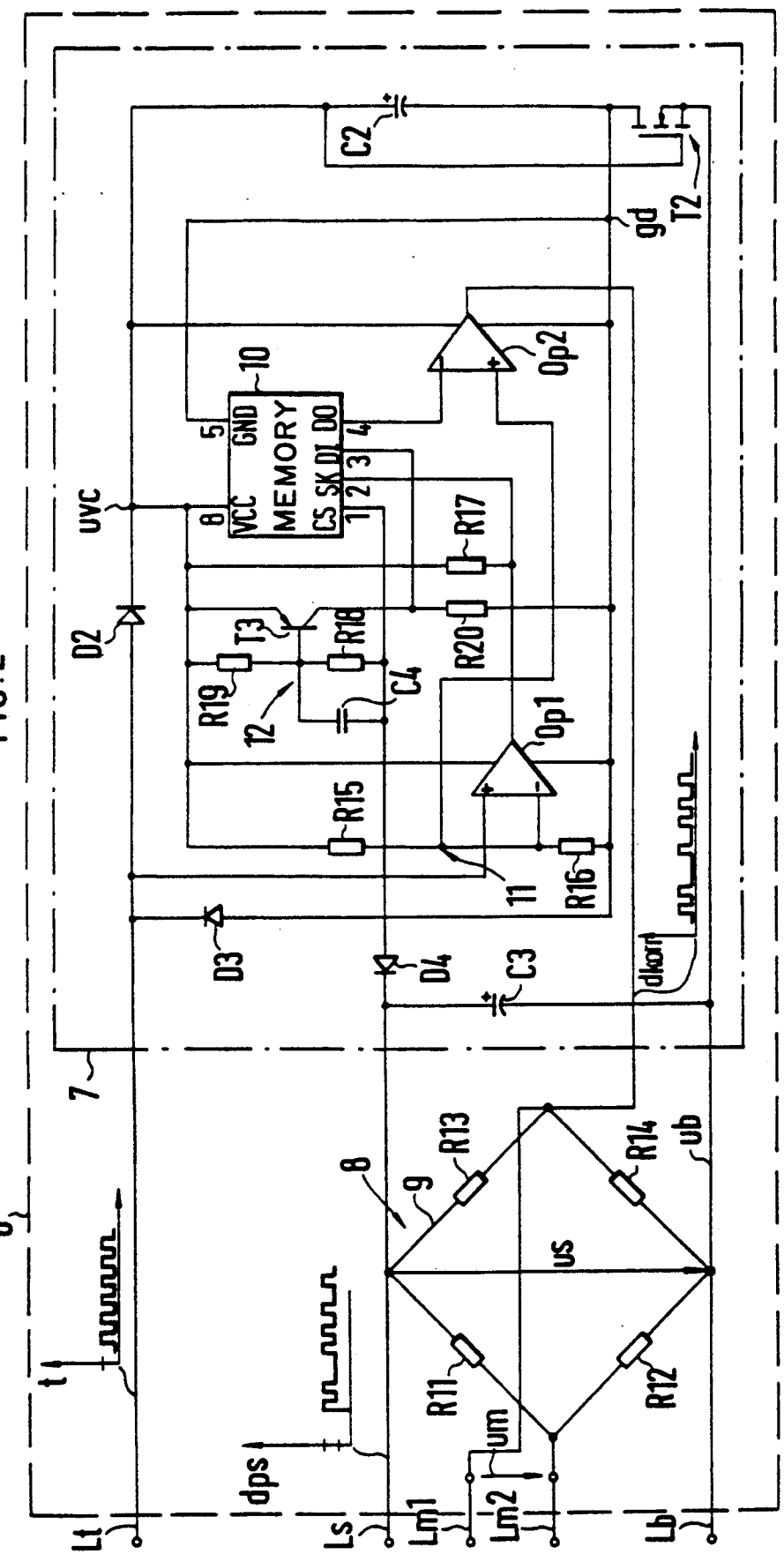

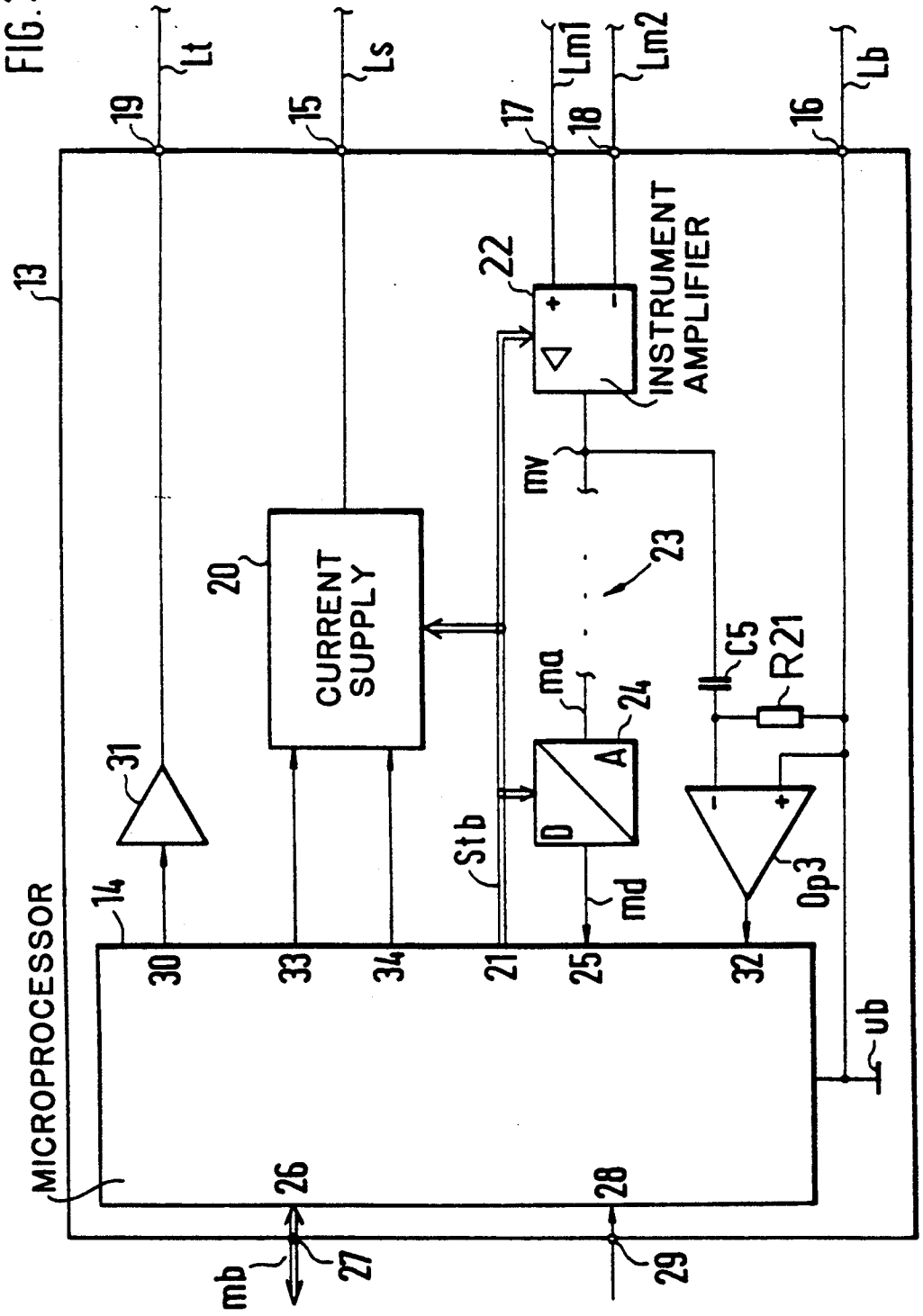

SENSOR HAVING AN ANSWERBACK DEVICE

BACKGROUND AND SUMMARY OF THE INVENTION

The present invention relates to a measuring sensor device for detecting a physical magnitude which is converted by way of a physical-electrical transducer into an equivalent electrical magnitude and is then converted into magnitudes or data adapted to be further processed by an evaluation circuit, connected to the output of the sensor device, which is structurally not combined with the sensor device and is connected with the same by way of electrical lines serving for the measured value transmission and/or the energy supply of the sensor.

In measuring apparatus or measurement data acquisition and processing systems, it is frequently necessary to spatially separate the measuring sensor device with the physical-electrical transducer, properly speaking, that picks up a physical magnitude and converts the same into an electrical signal equivalent thereto, from an evaluation circuit for the signal- (respectively measured value-) preparation and processing. The sensor device and the evaluation circuit are then as a rule connected with each other by way of electrical lines, whereby the lines themselves are connected with the evaluation circuit by way of a plug-type connection.

The separation of sensor device and evaluation circuit has frequently spatial reasons (in order to be able to build the sensor device as small as possible), however, it is also frequently based on the "rough" environment in which the measurement apparatus is to be operated. They are frequently extremely high or extremely low temperatures, dirt, humidity, high electromagnetic radiation, etc., conditions under which the measuring sensor devices can operate more or less perfectly, however, the functioning ability of an evaluation circuit with sensitive electronic components is not indicated.

A measuring sensor device with a physical-electrical transducer is known from the DE 34 46 248 A1 which is not structurally combined with an evaluation circuit. The sensor device includes a memory component with correcting data for the measured values detected by the physical-electrical transducer. The physical-electrical transducer and the memory component are connected by way of at least one output with the evaluation circuit which can read out the correction data from the memory component and correspondingly correct the measured values supplied by the transducer.

However, this known sensor device and the method for its compensation merely indicate a principle or the manner of operation of such a measurement system, but provide no indication for a technical realization that can be practiced. A programming of the memory component with the correction values additionally requires a connection of a large number of lines (bus connection) which after complete manufacture of the sensor are no longer accessible from the outside so that an "aged" sensor device (i.e., a sensor device which no longer supplies correct data), can no longer be re-calibrated; it must therefore be replaced.

A sensor device with an information carrier containing operating data (memory module) is disclosed in the DE 33 18 977 A1, in which data of the memory module are read-out during start of the operation by way of several connecting lines separate from the measurement lines and are transmitted to a remotely arranged microcomputer or the entire memory module has to be fetched and transferred into a processing part operating remote from the sensor device.

Several additional lines from the sensor to the processing part or a manual operating process thus become necessary which, on the one hand, is complicated and, on the other, may frequently lead to damages of the sensitive connecting contact pins of the memory component.

It is therefore the object of the present invention to provide a measuring sensor device with a correcting data memory component, which is not combined with an evaluation circuit and is connected with the latter by way of electric lines, whereby the sensor device is constructed in a simple manner and can be manufactured in a cost-favorable manner and from which the correction data can be read-out upon start of the operation by the use of simple means.

The underlying problems are solved according to the present invention in that the memory component is a component of an answerback device integrated into the sensor device which, for the transmission of identification and characteristic data, is coupled to at least two of the first and second lines normally utilized for the measured value transmission and/or energy supply of the sensor device and is connected with the evaluation circuit by way of a further third line serving for the transmission of a clock signal from the evaluation circuit to the answerback device, whereby the clock signal serves for the synchronization of the data transmission and the current supply of the answerback device.

The advantages of the present invention reside in the first instance in that a sensor device with a correction data-memory component has been created, from which the correction data can be read-out with simple means upon start of operation of the sensor device, in that lines are used for this read-out process which are far-reachingly present already and normally serve for the measured value transmission or the energy supply of the sensor device. The circuit (answerback device) to be arranged for that purpose in the sensor device is characterized by a small number of circuit elements and influences the detection during the measurement operation in a negligible manner. The answerback device is additionally characterized by a high operating temperature range. By a slight enlargement of the answerback device additional data can be inscribed from the evaluation circuit into the memory component of the sensor device during a calibration or re-calibration by way of the existing lines.

A further advantage results with this answerback device from the possibility to be able to store and read-out operating data of the sensor device in and from the memory component because the answerback device can be operated completely independently of the sensor, properly speaking (physical-electrical transducer).

BRIEF DESCRIPTION OF THE DRAWINGS

These and other objects, features and advantages of the present invention will become more apparent from the following description when taken in connection with the accompanying drawing which shows, for purposes of illustration only, several embodiments in accordance with the present invention, and wherein:

FIG. 1 is a schematic diagram of a sensor device according to the present invention with an answerback device for the read-out of sensor-identification and characteristic data;

FIG. 2 is a schematic diagram similar to FIG. 1 for a modified embodiment of a sensor device in accordance with the present invention with an answerback device for reading-in and reading-out data and having an increased temperature operating range; and FIG. 3 is a schematic diagram of an evaluation circuit in accordance with the present invention.

DETAILED DESCRIPTION OF THE DRAWINGS

Referring now to the drawing wherein like reference numerals are used throughout the various views to designate like parts, a measuring sensor device for the detection of a physical magnitude is indicated in FIG. 1 where it is designated by reference numeral 1. The sensor device includes a physical-electrical transducer generally designated by reference numeral 2, for example, a resistance measurement transmitter with the (variable) bridge resistances R1, R2, R3 and R4 connected into a full bridge. This can be, for example, a known strain gauge for detecting tensional stresses, pressures (diaphragm pick-up), forces (force-measuring cell), etc.

The resistance measurement transmitter is connected with an evaluation circuit to be described more fully hereinafter by way of lines Ls, Lb (second line) for the supply of a first bridge diagonal (supply voltage us), i.e., for the energy supply of the sensor device, and by way of lines Lm1 (first line) and Lm2 for receiving a measured voltage um from a second bridge diagonal.

For storing and outputting correction data, by means of which the electrical magnitude supplied by the physical-electrical transducer 2, i.e., the measured voltage coupled out by way of the lines Lm1 and Lm2, can be cleared of static and/or dynamic errors or deviations such as, for example, non-linearities, amplification- and zero point errors, an answerback device 4 is arranged in the sensor device 1 which includes as component a serially fetchable, non-volatile programmable and erasable memory component 5 (for example, EPROM, EEPROM).

The answerback device 4 is connected with the evaluation circuit by way of the line Lb (reference potential ub), by way of the line Lm1 (for the data output) and by way of a further line Lt (third line). The line Lt serves for the transmission of a clock signal t from the evaluation circuit to the answerback device 4. This clock signal t is utilized both for the purpose of initialization of the read-out process for the correction data from the memory component 5 as well as for the supply of the clock information necessary for the read-out process from the memory component 5 (synchronization of the data transmission) and for the energy (current supply of the answerback device 4).

For purposes of current supply of the answerback device 4, the clock signal t from the line Lt is rectified by way of a diode D1 and filtered by way of a resistance R5 and a condenser C1 connected with respect to reference potential ub. A Zener diode Z takes care of a necessary voltage limitation of the supply voltage of the memory component (inputs UV, G). It receives the clock information necessary for the read-out of the correction data from the memory component 5 by way of an input C from a voltage divider consisting of resistances R6 and R7 which is connected between the lines Lt and Lb.

The serial bit pattern current dkorr of the data words of the correction data which appears at an output A of the memory component 5, is connected by way of a further voltage divider consisting of the resistances R8 and R9 to the base of a transistor T1 which in case of a positive pulse of the bit pattern current at the base B of the transistor T1 pulls down its potential at the collector K nearly to the potential of the emitter E (reference potential ub) and thus connects a resistance R10 in parallel with the resistance R4; the measurement bridge 3 fed with the supply voltage us is thereby de-tuned so that the evaluation circuit can detect a changed measured value um (or a changed potential) on the line Lm1 and can evaluate the same.

If, by contrast, a pulse at the reference potential ub appears at the output A of the memory component 5, then the transistor T1 is not activated and its collector-emitter resistance remains high-ohmic so that the resistance R4 (of the measurement bridge 3) remains nearly unchanged and the measurement bridge 3 thus remains far-reachingly uninfluenced; the same is true when the clock signal t after termination of the output of the sensor identification and characteristic data is turned off, i.e., the sensor device passes over into the measurement operation.

A sensor device 6 with an answerback device 7 which is suitable both for the read-out as also for the read-in of sensor identification and characteristic data is shown in FIG. 2. The sensor device 6 includes in a similar manner as the sensor device 1 a physical-electrical transducer 8 in the form of a measurement bridge 9 having resistances R11, R12, R13 and R14 and is connected with the evaluation circuit by way of the same lines Lb, Ls, Lm1, Lm2 and Lt. The answerback device 7 of the sensor device 6, however, has certain peculiarities compared to the answerback device 4 of the sensor 1. In order to be able to read-in data (for example, during a calibration operation) into a memory component 10, in addition to the reading-out of data, the answerback device 7 is connected to the line Ls (fourth line) in addition to being connected to the lines Lb, Lm1 and Lt, by way of which a selection signal, Chip Select cs, as well as commands, addresses and data for the memory component 10 can be read into the answerback device 7; the line Ls is acted upon by the evaluation circuit with a so-called three-level signal dps, whereby a first logic level (zero voltage) corresponds to no activation, a second logic level (2.5 volts) corresponds to the selection signal cs and a logic one of a command-, address-, or data word and a third logic level (5 volts) corresponds to the selection signal cs and a logic zero of a command-, address- or data word.

The line Ls can also receive the energy supply for the sensor device 6 in an emergency. Also, in an emergency, the line Ls can be used as an output to transmit an electric magnitude that relates to a measured value.

The clock signal t in the line Lt serves again for the activation and current supply of the answerback device 7. The current supply takes place by rectification of the clock signal t by way of two diodes D2 and D3 which charge a condenser C2 (for smoothing); the difference of the supply potential uvc and of the (answerback internal) reference potential gd is then available for the energy supply of the answerback device at the connecting lugs thereof.

A further peculiarity results from the field-effect transistor T2 connected between the answerback internal reference potential gd and the reference potential ub of the sensor device 6 which is at the supply potential uvc with its gate electrode: it pulls down, upon activation of the answerback device 7 with the clock signal, that is, with the charging of the condenser C2, the internal reference potential gd to the reference potential ub whereas with a non-activated answerback device 7, i.e., with a turned-off clock signal t (respectively with uvc=gd) the field-effect transmitter T2 becomes high-ohmic so that the measurement resistance R14 and therewith the measurement bridge 9 remains practically uninfluenced.

The memory component 10 is of the type NMC9364E (serial EEPROM) and is connected by way of pin 8 (input VCC) to the supply potential uvc and by way of pin 5 (input GND) to the reference potential gd. The selection signal cs, pin 1 (input CS), is gained from the three-level signal dps by way of a condenser C3 connected between the lines Ls and Lb and a diode D4. The clock signal t of the line Lt prepared by way of a comparator Op1 is fed to a clock input SK (pin 2) of the memory component 10, whereby a (switching-) reference level is produced in the negative input of the comparator Op1 by a voltage divider 11 consisting of the resistances R15 and R16 and connected between uvc and gd; the output of the comparator Op1 is additionally connected to uvc by means of a resistance R17.

Control informations, addresses and data are gained from the three-level signal dps by way of a separating circuit generally designated by reference numeral 12. The latter receives its information by way of the diode D4 from the line Ls and applies it by way of a voltage divider (resistances R18 and R19) connected to uvc, to the base of a transistor T3, whereby a condenser C4 is connected in parallel with the resistance R18, i.e., between the diode D4 and the base of the transistor T3 (C4 serves for the improvement of the leading and trailing edges). The collector of the transistor T3 is finally connected with the input DI (DATA IN), pin 3, of the memory component 10, whereby the collector is connected by way of the resistance R20 with gd and the emitter of the transistor T3 with uvc.

The data output DO (DATA OUT), pin 4 of the memory component is connected with the negative input of a further comparator Op2 for producing the (sensor-identification and characteristic data-) bit pattern current dkorr; the positive input thereof is connected to the voltage divider 11. As a result thereof, the comparator Op2 is able to connect the line Lm1 to the potentials uvc or gd, respectively, to de-tune the bridge branch having the resistance R14 at the cycle of the bit pattern current dkorr so that the evaluation circuit can detect therefrom the sensor identification and characteristic data.

An evaluation circuit 13 with a microcomputer 14 is finally illustrated in FIG. 3. The evaluation circuit 13 includes plug-in contacts 15 and 16 for the connection of the lines Ls and Lb (energy supply of the sensor device), plug-in contacts 17 and 18 for the connection of the lines Lm1 and Lm2 (measured value transmission) and a plug-in contact 19 for the connection of the lines Lt (clock signal t).

For the energy supply the line Lb is at reference potential ub (ground) and for producing the supply voltage us the line Ls is connected to a current supply part 20 which is adapted to be parameterized preferably from the microcomputer 14 (output 21) by way of a control bus Stb so that it can produce task-specific, i.e., sensor-dependent, different feed voltages us.

The measured voltage obtained by way of the lines Lm1 and Lm2 is applied to an instrument amplifier 22 which may also be parameterizable (amplification factor and zero point) by way of the control bus Stb, and is amplified (amplified measured signal mv). The amplified measured signal mv passes through the analog-processing path 23 customary for such sensor devices having (preferably parameterizable) filters, amplifiers, etc. (not shown) up to an analog-/digital converter 24, which converts the analog signal values ma into digital values md and feeds the same to the microcomputer 14 by way of the input 25. Finally, the microcomputer 14 (input-/output 26, connection 27) is connected by way of a bus system mb with further data-processing apparatus or input/output apparatus and by way of an input 28 (connection 29) with an external current supply.

The evaluation circuit can thereby be constructed completely identically to a measuring module (however, with separate, i.e., non-integrated sensor device, respectively, physical-electrical transducer), as is described, for example, in the patent application filed by the assignee of the present application concurrent with the priority application of the present invention, in Germany on Dec. 23, 1987, application No. DE-P-37 43 487.6-53, entitled "Measured Data Detection- and Processing System."

For purposes of reading-out/reading-in the sensor identification and characteristic data, the evaluation 13 now has some peculiarities:

The microcomputer can produce the clock signal t by way of an output 30 and can connect the same to the line Lt by way of an amplifier 31;

The amplified measured signal mv at the output of the instrument amplifier 22 is connected by way of a condenser C5 and a resistor R21 connected with ground to a comparator Op3 which detects the data current with the serial sensor identification and characteristic data of the memory component 5, respectively, 10, transmitted by way of the detuning of the measurement bridge 3, respectively, 9 and the lines Lm1 and Lm2, and feeds the same prepared to an input 32 of the microcomputer 14;

The three-level signal dps required for the sensor device 6 is produced by means of the current supply part 20 which for that purpose receives from the microcomputer 14 a selection signal cs by way of an output 33 and a data signal with control information, addresses and data by way of an output 34, adds the same and connects the same as three-level signal dps to the line Ls.

The operation of the read-out of the data takes place as follows:

After plugging-in the lines Lt, Ls, Lm1, Lm2 and Lb (i.e., of the sensor device 1 or 6) into the evaluation circuit 13, the latter initially connects the clock signal t to the line Lt and thus activates the read-out process, so to speak of. In the sensor device 6, the three-level signal dps with a control information "read-out data", followed by a bit current with addresses, among which are stored the sensor identification and characteristic data, is additionally connected to the line Ls.

The sensor device 1, 6 thereupon transmits by way of the lines Lm1, Lm2 the sensor identification and characteristic data (in alternation with the addresses sent out from the evaluation circuit according the preceding step).

The evaluation circuit receives the sensor identification and characteristic data which, in addition to preferably containing the correction data for the compensation of static and/or dynamic transducer properties of the sensor device or of parts of the entire evaluation circuit, such as, for example, amplification- and zero-point errors, non-linearities, etc., also contains additional operating data for the sensor device such as, for example, the model, the required supply voltage, the type of the output data, the detected physical magnitudes, the measurement range, etc., stores the same temporarily and after reception of all sensor identification and characteristic data turns off the clock signal t and the three-level signals.

Thereupon, current supply part 20, the instrument amplifier 22, the analog signal preparation path 23 and the analog-/digital converter 24 are parameterized, and the measurement operation can commence.

The reading-in of sensor identification and characteristic data takes place in a similar manner by connecting the clock signal t to the line Lt and of the three-level signal dps to the line Ls whereby, however, the data to be read in are outputted at the output 34 of the microcomputer 14 for that purpose. The bit current thereby includes the control information "read-in data", followed by an address and a date to be stored under the same. In this manner, the operating data of the sensor device as also the correction data gained during a calibration are adapted to be inscribed into the memory 10. A high-grade flexible and movable system is thus gained by the combination of the sensor device 1 or 6 and the evaluation circuit 3 as in particular The evaluation circuits can be constructed completely identically for a large number of types of sensor devices;

The evaluation circuits can be constructed stationary (or movable) and the measurement object can be equipped with sensor devices completely independently thereof, whereby the sensor devices can remain at the measurement object and can be connected only in case of need to the measurement circuits (for example, in a motor vehicle after terminating the test drive);

During the exchange of the physical/electrical transducer 2 or 8, for example, in case of a defect, the transducer can be exchanged for another, for example, with completely different operating data without having to change anything in the evaluation circuit;

During a calibration (and during measurement use) the sensor device does not have to be operated necessarily tied to a specific evaluation circuit, etc.

A further important advantage results additionally in conjunction with the sensor device 6 according to FIG. 2 if the components of the answerback device 7 are selected corresponding to the specification listed in the following table: More particularly, the answerback device is then capable of use within a temperature range very large for semi-conductor circuits, namely, from −40° C. to +130° C. so that the sensor device can also remain at "hot" and "cold" measurement locations.

TABLE

| Component Designation | Component Specification |
| --- | --- |
| Semiconductor | |
| Reference Numeral 10 (EEPROM) | NMC9346E |
| T2 (Field-Effect Transistor) | BSS123 |
| T3 (PNP-Transistor) | BC857C |

TABLE-continued

| Component Designation | Component Specification |
| --- | --- |
| Op1 (Comparator) | LM2903M |
| Op2 (Comparator) | LM2903M |
| D2 (Diode) | BAS40-04 |
| D3 (Diode) | BAS40-04 |
| D4 (Diode) | BAS40-04 |
| Resistances | |
| R 15 | 10k ohms |
| R 16 | 10k ohms |
| R 17 | 10k ohms |
| R 18 | 10k ohms |
| R 19 | 4.7k ohms |
| R 20 | 10k ohms |
| Condensers | |
| C 2 (Electrolytic) | 33 µF/16 V |
| C 3 (Electrolytic) | 0.33 µF/35 V |
| C 4 | 3.3 nF |

While we have shown and described several embodiments in accordance with the present invention, it is understood that the same is not limited thereto but is susceptible numerous changes and modifications as known to those skilled in the art, and we therefore do not wish to be limited to the details shown and described herein but intend to cover all such changes and modifications as are encompassed by the scope of the appended claims.

We claim:

1. A sensor device for the detection of a physical magnitude and the conversion of the physical magnitude into an equivalent electric magnitude to be processed by an evaluation circuit that is physically separate from the sensor device and is remotely coupled to the sensor device via electric lines, comprising:

a first input coupled to a first electric line and receiving energy for the sensor device;

a second input coupled to a second electric line and receiving a clock signal;

a first output coupled to a third electric line and transmitting an electric magnitude relating to a measured value;

a transducer coupled to the first input and the first output and converting physical magnitudes into electric magnitudes;

a non-volatile memory containing characteristic data of the sensor device, the characteristic data being used by the evaluation circuit for correcting the electric magnitudes transmitted at the first output; and an answerback device containing said non-volatile memory and coupled to the second input, said clock signal providing synchronization of transmission of characteristic data and current supply for the answerback device, said answerback device including means for switchably coupling said non-volatile memory to said first output such that said characteristic data is transmitted at said first output;

wherein the second input is directly connected to the non-volatile memory, said answerback device further including at least one diode and a condenser coupled to said second input, said diode and condenser converting said clock signal into current supply.

2. An arrangement for the detection and evaluation of a physical magnitude, comprising:

a measuring sensor device having:

a physical-electrical transducer having an output and a measuring bridge containing only passive devices, said transducer converting physical magnitudes into equivalent analog electrical magnitudes; and an answerback device coupled to the transducer and having a non-volatile memory which stores correction data of the measuring sensor device, said answerback device having an output at which is provided a data bit flow serially read out of the non-volatile memory, the answerback device also having a controllable switching element connected in parallel to a branch of the measuring bridge, said switching element in a first condition being high-ohmic with respect to said branch, and being controlled by the answerback device into a second condition to tune the measuring bridge so as to transmit correction data, said controllable switching element being switched on and off by the answerback device according to the data bit flow serially read out of said memory device; and an evaluation circuit structurally separate from the measuring sensor device and connected to the output of the transducer by electrical lines over which measured values of the measuring sensor device are transmitted, said evaluation circuit detecting changes in said output of the measuring bridge to reconstruct said correction data, and said evaluation circuit using the correction data to correct the electrical magnitudes output by the transducer.

3. A sensor device according to claim 2, wherein the controllable switching element is a series circuit that includes an operational amplifier circuit and a field-effect transistor.

4. The arrangement according to claim 2, further comprising: a clock line that is connected between the answerback device and the evaluation circuit, said clock line carrying a superimposed clock signal that activates the answerback device to transmit of said correction data, synchronizes the transmission of the correction data, and is a current supply of the answerback device; and a diode and an RC circuit coupled between the clock line and the answerback device that rectifies and smooths the current supply.

5. A sensor device according to claim 2, wherein the controllable switching element is a transistor.

6. A sensor device according to claim 5, wherein the transistor is a field-effect transistor.

7. A sensor device according to claim 2, wherein said answerback device receives a three-level signal from said evaluation circuit that includes control information, addresses and data and a superimposed control signal for the non-volatile memory, said answerback device including a separating circuit separating the three-level signal into control information, addresses, data and the control signal.

8. A sensor device according to claim 7, wherein the characteristic data includes at least one of:
   sensor identification data;
   correction data for compensating for static and dynamic transducer properties of the sensor device;
   correction data for compensating for static and dynamic properties of the evaluation circuit such as amplifier-, zero-point errors, non-linearities, etc.;
   operating data for the sensor device; and
   operating data for the transducer.

9. A sensor device according to claim 8, wherein the non-volatile memory is an erasable and programmable memory having serial data output and data input.

* * * * *